(12) United States Patent
Hong

(10) Patent No.: US 7,880,206 B2
(45) Date of Patent: *Feb. 1, 2011

(54) CMOS IMAGE SENSOR WITH ASYMMETRIC WELL STRUCTURE OF SOURCE FOLLOWER

(75) Inventor: Hee-Jeong Hong, Chungcheongbuk-do (KR)

(73) Assignee: Crosstek Capital, LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/505,131

(22) Filed: Jul. 17, 2009

(65) Prior Publication Data

US 2009/0278180 A1 Nov. 12, 2009

Related U.S. Application Data

(63) Continuation of application No. 11/319,560, filed on Dec. 29, 2005, now Pat. No. 7,589,349.

(30) Foreign Application Priority Data

Dec. 30, 2004 (KR) .......................... 2004-0115878

(51) Int. Cl.
*H01L 31/113* (2006.01)

(52) U.S. Cl. .................... 257/292; 257/69; 257/195; 257/219; 257/225; 257/239; 257/240; 257/241; 257/246; 257/291; 257/293; 257/350; 257/351; 257/357; 257/358; 257/359; 257/E27.082; 257/E27.083; 257/E27.15; 257/E27.151; 257/E27.152

(58) Field of Classification Search ............... 257/69, 257/195, 219, 225, 239, 240, 241, 246, 350, 257/351, 357, 358, 359, E27.082, E27.083, 257/E27.15, E27.151, E27.152
See application file for complete search history.

(56) References Cited

U.S. PATENT DOCUMENTS

| 6,040,593 | A | 3/2000 | Park |
| 6,084,259 | A * | 7/2000 | Kwon et al. ................. 257/292 |
| 6,441,412 | B2 | 8/2002 | Oh et al. |
| 7,589,349 | B2 * | 9/2009 | Hong ........................... 257/69 |
| 2002/0009822 | A1 * | 1/2002 | Park ............................. 438/57 |
| 2004/0217426 | A1 | 11/2004 | Lee |

* cited by examiner

*Primary Examiner*—Long K Tran
(74) *Attorney, Agent, or Firm*—McAndrews, Held & Malloy, Ltd.

(57) ABSTRACT

Provided is a CMOS image sensor with an asymmetric well structure of a source follower. The CMOS image sensor includes: a well disposed in an active region of a substrate; a drive transistor having one terminal connected to a power voltage and a first gate electrode disposed to cross the well; and a select transistor having a drain-source junction between another terminal of the drive transistor and an output node, and a second gate electrode disposed in parallel to the drive transistor. A drain region of the drive transistor and a source region of the select transistor are asymmetrically arranged.

22 Claims, 5 Drawing Sheets

CMOS IMAGE SENSOR WITH ASYMMETRIC WELL STRUCTURE OF SOURCE FOLLOWER

CROSS REFERENCE TO RELATED APPLICATIONS

This application is a continuation of U.S. patent application Ser. No. 11/319,560, filed on Dec. 29, 2005, entitled "CMOS IMAGE SENSOR WITH ASYMMETRIC WELL STRUCTURE OF SOURCE FOLLOWER", the entirety of which is incorporated herein by reference.

FIELD OF THE INVENTION

The present invention relates to an image sensor; and, more particularly, to a CMOS image sensor capable of preventing characteristic degradation of a dead zone in a source follower.

DESCRIPTION OF THE RELATED ART

An image sensor is a semiconductor device that converts an optical image into an electric signal. Image sensors can be classified into charge coupled device (CCD) image sensors and complementary metal oxide semiconductor (CMOS) image sensors.

In the case of the CCD image sensor, respective MOS capacitors are arranged very close to one another, and charge carriers are stored in the MMOS capacitors and transferred thereto.

On the contrary, the CMOS image sensor includes a plurality of unit pixels fabricated through CMOS processes. Each of the unit pixels includes one photodiode and three or four transistors for driving the unit pixel. The CMOS image sensor employs CMOS technology that uses a control circuit and a signal processing circuit as a peripheral circuit. MOS transistors are formed as many as the number of pixels, and output data are successively detected using the MOS transistors.

In fabricating these various kinds of image sensors, many attempts to increase photosensitivity have been made. One of them is an integrating technology. For example, the CMOS image sensor includes a photodiode for sensing light and a CMOS logic circuit for processing the sensed light into an electric data signal. Many researchers have focused to increase a fill factor to increase photosensitivity. The fill factor is a ratio of a photodiode with respect to a total area of the image sensor.

FIG. 1 is a circuit diagram of a unit pixel of a CMOS image sensor, in which the unit pixel includes four transistors.

The unit pixel of FIG. 1 is formed using a sub-micron CMOMS epitaxial process to increase photosensitivity and reduce crosstalk effect between unit pixels.

Referring to FIG. 1, the unit pixel of the image sensor includes a photodiode PD formed in a PNP junction, a PNPN junction or the like, a transfer transistor TX, a floating diffusion node FD, a reset transistor RX, a drive transistor DX, and a select transistor SX. The photodiode PD receives light from an object to generate corresponding electron-hole pairs, i.e., photogenerated charges. The transfer transistor TX transfers the photogenerated charges accumulated at the photodiode PD to the floating diffusion node FD when the transfer transistor TX is turned on. The floating diffusion node FD receives the photogenerated charges transferred from the transfer transistor TX when the transfer transistor TX is turned on. The reset transistor RX resets the floating diffusion node FD to a power voltage level VDD in response to a reset signal. In the drive transistor DX, the amount of turning on a drive gate is varied with an electric signal corresponding to the photogenerated charges transferred from the floating diffusion node FD, so that the drive transistor DX outputs the electric signal in proportion to the amount of the photogenerated charges. The select transistor SX, which is turned on by a control of a select signal, outputs a signal of the unit pixel outputted through the drive transistor DX.

In FIG. 1, a reference numeral LX represents a load transistor. The floating diffusion node FD has a predetermined capacitance Cfd.

An operation principle of obtaining an output voltage VOUT from the unit pixel illustrated in FIG. 1 will be described below in detail.

First, the transfer transistor TX, the reset transistor RX, and the select transistor SX are turned off. At this time, the photodiode PD is in a full depletion state. A light integration is started to collect the photogenerated charges at the photodiode PD.

The floating diffusion node FD is reset as the reset transistor RX is turned on. Then, the select transistor SX is turned on. At this time, a first output voltage V1 of the unit pixel at a reset operation is measured as the output voltage VOUT. The measured value means a DC level shift of the floating diffusion node FD.

After an appropriate light integration time, the transfer transistor TX is turned on so that all the photogenerated charges at the photodiode PD are transferred to the floating diffusion node FD. Then, the transfer transistor TX is turned off.

A second output voltage V2 due to the charges transferred to the floating diffusion node FD is measured as the output voltage VOUT.

The output voltage VOUT, which is a transfer result of the photogenerated charges, is obtained from the difference between the output voltage V1 and the output voltage V2. That is, the output voltage V1-V2 is purely a signal voltage in which noise is excluded. This method is referred to as a correlated double sampling (CDS).

Then, the above processes are repeated.

FIG. 2A is a plan view of the select transistor and the drive transistor in the unit pixel of FIG. 1. The select transistor and the drive transistor construct a source follower.

As shown, an active region ACT is formed in a line shape. A P-well is formed in a region of the select transistor SX and the drive transistor DX on the active region ACT. The drive transistor DX and the select transistor SX are symmetrically arranged on the P-well. A drain of the drive transistor DX is connected to a power voltage VDD, and a source of the select transistor SX is connected to an output node VOUT.

The drive transistor DX and the selector transistor SX include gates G1 and G2 crossing the P-well, respectively. The gates G1 and G2 are symmetrically arranged on the P-well.

FIG. 2B is a graph of a potential barrier in FIG. 2A.

As shown, a potential barrier exists in the drain region of the drive transistor DX and has a gently-sloped distribution. However, a large potential barrier exists in the source of the select transistor SX connected to the output node VOUT.

FIG. 3 is a cross-sectional view taken along the line A-A' of FIG. 2A.

It can be seen from FIG. 3 that the drive transistor DX and the select transistor SX are symmetrically arranged on the P-well.

The potential barrier in the source region of the select transistor SX connected to the output node VOUT blocks a signal flow. Consequently, as indicated by a portion A, a dead zone may increase and thus, a variation of a dead zone signal may increase.

SUMMARY OF THE INVENTION

It is, therefore, an object of the present invention to provide a CMOS image sensor that is capable of preventing a dead zone characteristic from being degraded due to a potential barrier existing in an output node of a select transistor.

In accordance with an aspect of the present invention, there is provided a CMOS image sensor, including: a well of a first conductivity type, disposed on a substrate of the first conductivity type; an impurity region for a drive transistor, disposed to cross the well and connected to a power voltage; a first gate electrode of a second conductivity type, connected to the impurity region for the drive transistor; a second gate electrode of the second conductivity type, arranged in parallel to the first gate electrode; and an impurity region of the second conductivity type for a select transistor, connected to the second gate electrode and an output node, wherein a width of the well disposed under the impurity region for the drive transistor is larger than a width of the well disposed under the impurity region for the select transistor.

In accordance with another aspect of the present invention, there is provided a CMOS image sensor, including: a well disposed in an active region of a substrate; a drive transistor having one terminal connected to a power voltage and a first gate electrode disposed to cross the well; and a select transistor having a drain-source junction between another terminal of the drive transistor and an output node, and a second gate electrode disposed in parallel to the drive transistor, wherein a drain region of the drive transistor and a source region of the select transistor are asymmetrically arranged.

In forming a unit pixel using three or four MOS transistors, two transistors (a drive transistor and a select transistor) construct a source follower. In order to minimize a variation of a dead zone signal and reduce a dead zone level, uniformity between pixels is important in the drive transistor, and a reduction of a potential barrier is important in the source side of the select transistor connected to the output node.

In accordance with the present invention, the drive transistor and the select transistor are asymmetrically arranged on the P-well by increasing a margin with respect to the P-well in the drain side of the drive transistor and decreasing a margin with respect to the P-well in the source side of the select transistor.

Accordingly, uniformity of the drive transistor between pixels can be improved, and the dead zone characteristic can be improved by reducing the potential barrier in the portion of the select transistor connected to the output node.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A CMOS image sensor with an asymmetric well structure of a source follower in accordance with exemplary embodiments of the present invention will be described in detail with reference to the accompanying drawings.

Figure 1:
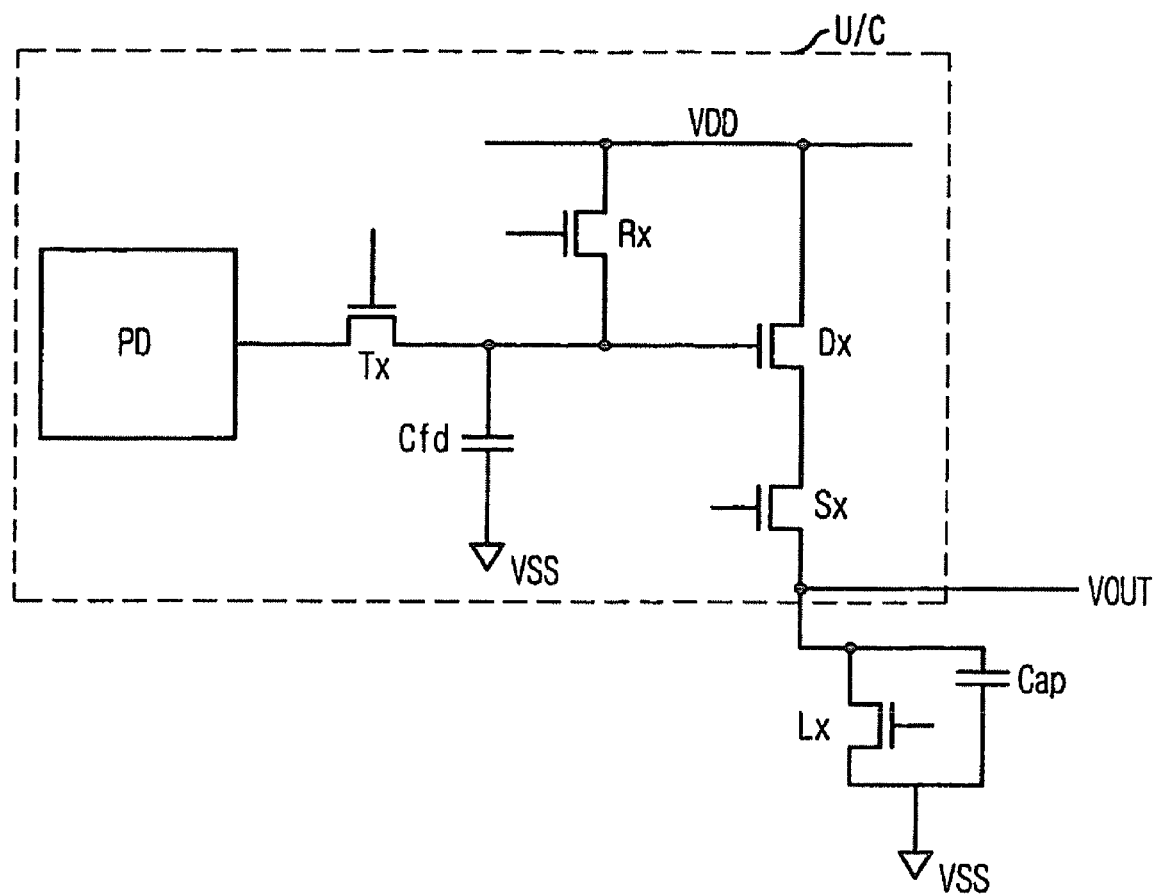
FIG. 1 is a circuit diagram of a unit pixel of a conventional CMOS image sensor, in which the unit pixel includes four transistors.
Figure 2A:
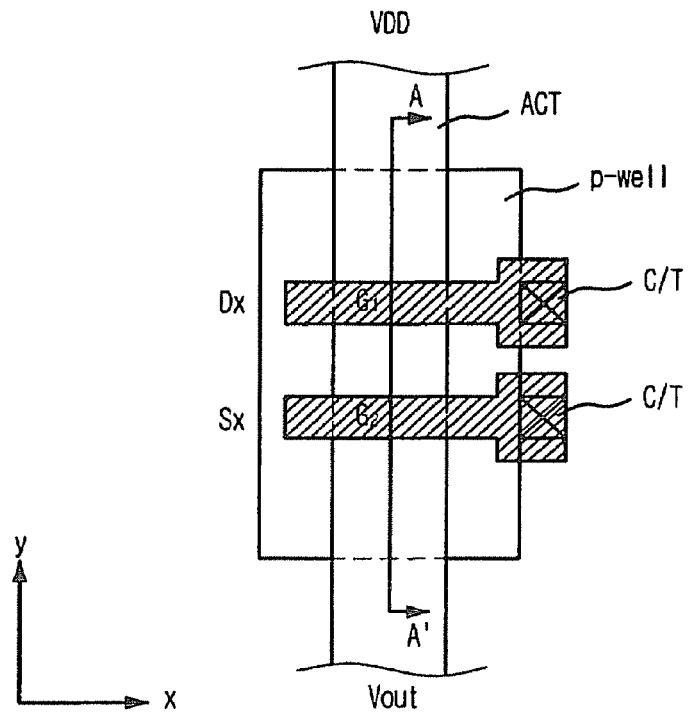
FIG. 2A is a plan view of a select transistor and a drive transistor constructing a source follower in the unit pixel of FIG. 1.
Figure 2B:
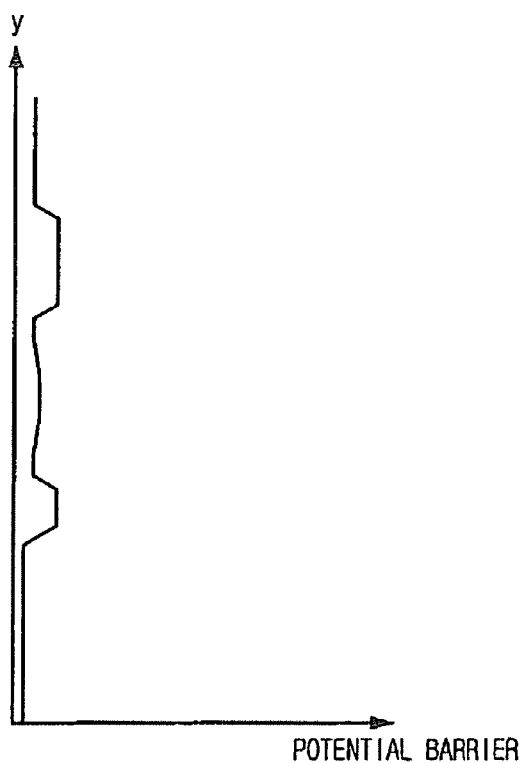
FIG. 2B is a graph of a potential barrier in FIG. 2A.
Figure 3:
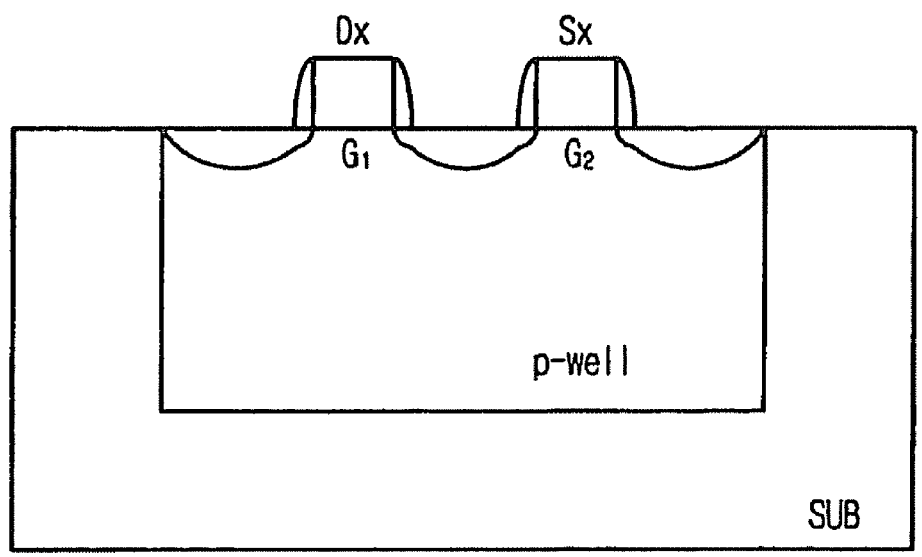
FIG. 3 is a cross-sectional view taken along the line A-A' of FIG. 2A.
Figure 3:
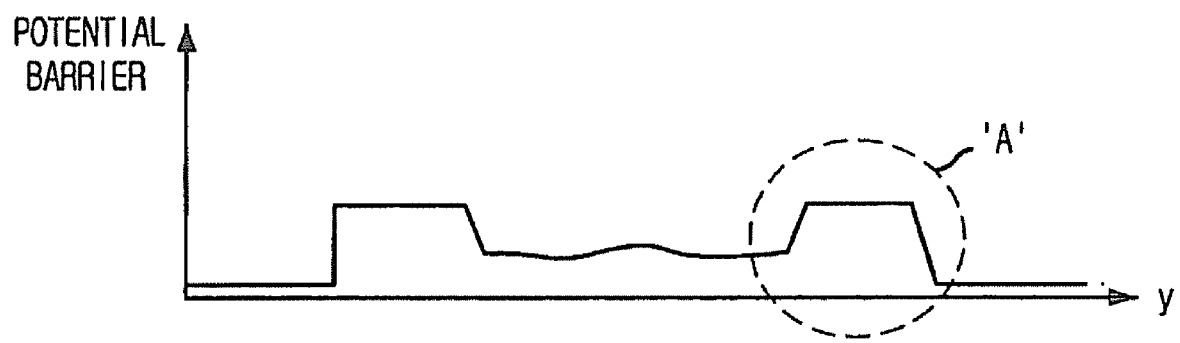
Figure 4A:
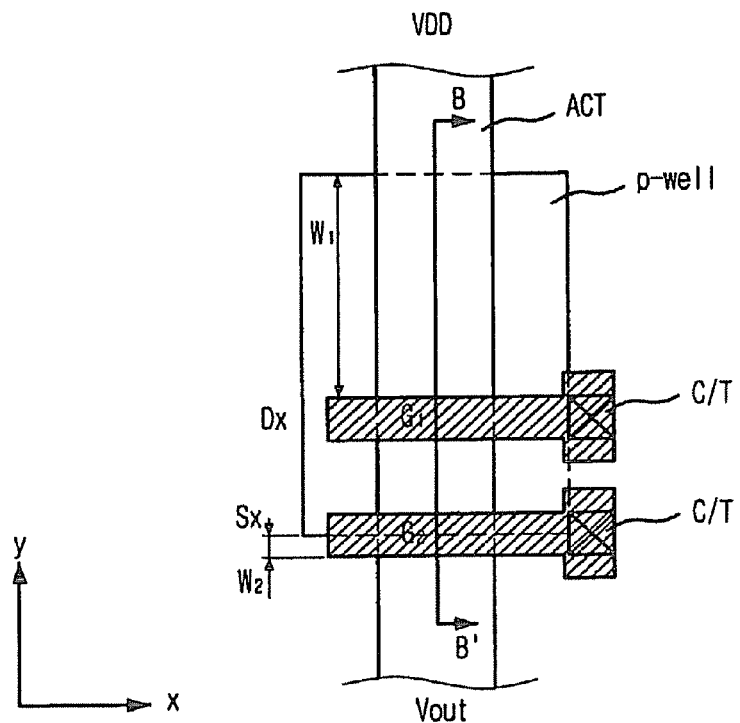
FIG. 4A is a plan view of a select transistor and a drive transistor constructing a source follower in accordance with an embodiment of the present invention.

FIG. 4A is a plan view of a select transistor and a drive transistor in a CMOS image sensor in accordance with an embodiment of the present invention. The select transistor and the drive transistor construct a source follower.

Referring to FIG. 4A, an active region ACT is formed in a line shape. A P-well is formed in a region of the select transistor SX and the drive transistor DX on the active region ACT. The drive transistor DX and the select transistor SX are asymmetrically arranged on the P-well. A drain of the drive transistor DX is connected to a power voltage VDD, and a source of the select transistor SX is connected to an output node VOUT.

The drive transistor DX and the selector transistor SX include gates G1 and G2 crossing the P-well, respectively. In the conventional CMOS image sensor, the gates G1 and G2 are symmetrically arranged on the P-well. On the contrary, according to the present embodiment, a width W1 of the P-well in the drain region of the drive transistor DX connected to the power voltage VDD is large, while a width W2 of the P-well in the source region of the select transistor SX connected to the output node Vout is small.

Figure 4B:
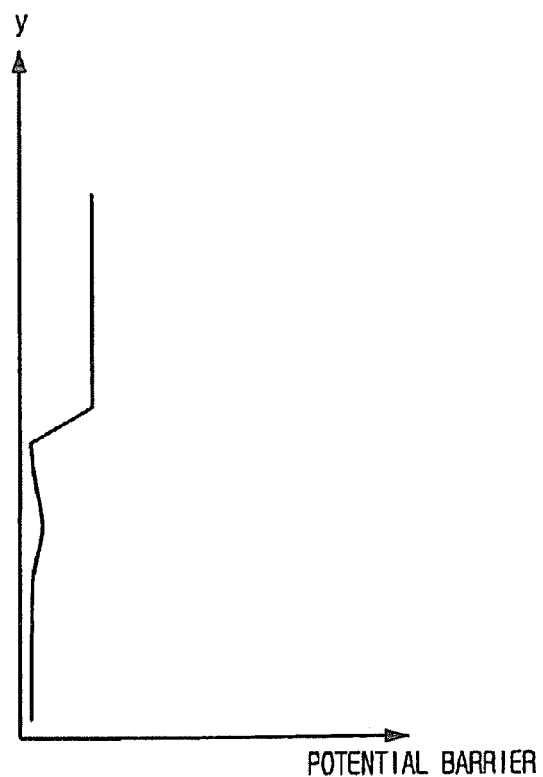
FIG. 4B is a graph of a potential barrier in FIG. 4A.

FIG. 4B is a graph of a potential barrier in FIG. 4A.

In the conventional CMOS image sensor, the potential barrier exists in the drain region of the drive transistor DX and has a gently-sloped distribution. However, a large potential barrier exists in the source region of the select transistor SX connected to the output node VOUT. On the contrary, according to the present embodiment, the source region of the select transistor SX is almost not disposed in the P-well. Therefore, it can be observed that the potential barrier in this region is almost removed.

At this time, it is preferable that the width W1 is in a range from about 0.33 μm to about 1.0 μm, and the width W2 is in a range from about −0.1 μm to −0.33 μm. The negative value of the width W2 means that an end of the P-well is disposed below the gate G2 of the select transistor SX.

The modification of the widths W1 and W2 means that the drive transistor DX and the select transistor SX are partially shifted such that they have not a symmetrical well structure but an asymmetric well structure, without changing the size of the P-well.

Figure 5:
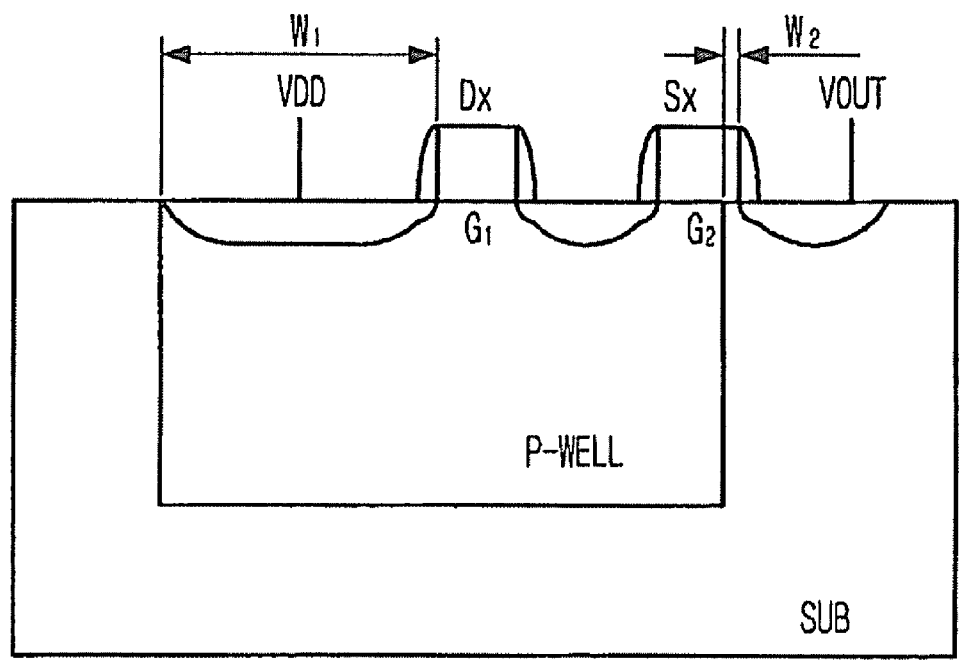
FIG. 5 is a cross-sectional view taken along the line B-B' of FIG. 4A.
Figure 5:
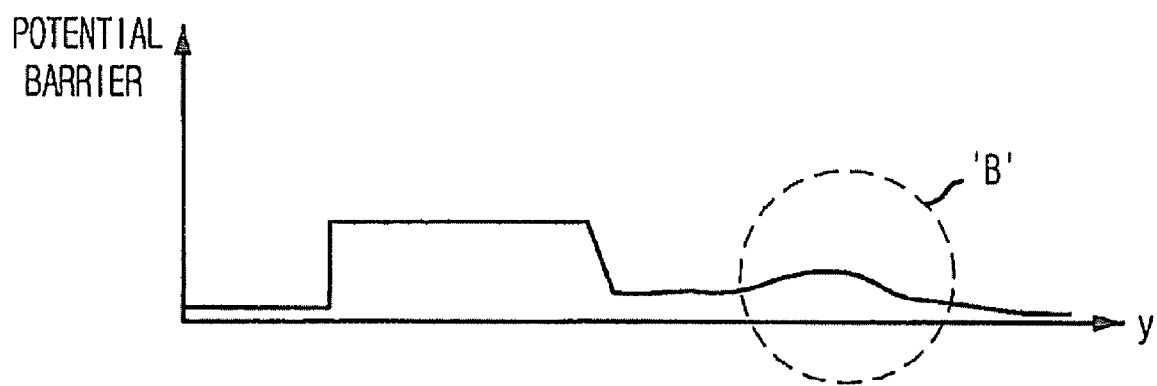

FIG. 5 is a cross-sectional view taken along the line B-B' of FIG. 4A.

It can be seen from FIG. 5 that the drive transistor DX and the select transistor SX are asymmetrically arranged on the P-well.

Since there is almost no potential barrier in the source region of the select transistor SX connected to the output node VOUT, a signal flow is not blocked. Consequently, as indicated by a portion B, a dead zone decreases and thus, a variation of a dead zone signal decreases.

As described above, the potential barrier in the source region of the select transistor connected to the output node can be reduced by asymmetrically arranging the drive transistor and the select transistor of the source follower on the P-well. Consequently, the dead zone level decreases and thus, the variation of the dead zone signal decreases. Also, a dynamic range of the source follower is increased, and as a result, an image saturation level can be improved. A low light characteristic of the image sensor can be enhanced, resulting in an improvement on the performance of the image sensor.

The present application contains subject matter related to the Korean patent application No. KR 2004-0115878, filed in the Korean Patent Office on Dec. 30, 2004, the entire contents of which being incorporated herein by reference.

While the present invention has been described with respect to the particular embodiments, it will be apparent to those skilled in the art that various changes and modifications may be made without departing from the scope of the invention as defined in the following claims.

What is claimed is:

1. A unit pixel, comprising:
   a well disposed in an active region of a substrate;
   a drive transistor including:
      a terminal coupled to a power voltage; and
      a first gate electrode across the well; and
   a select transistor including:
      a drain-source junction between another terminal of the drive transistor and an output node of the unit pixel; and
      a second gate electrode across the well;
   wherein a width of the well disposed under an impurity region for the select transistor is in a range from approximately −0.1 μm to approximately −0.33 μm.

2. The unit pixel of claim 1, wherein a width of the well between a boundary of the well and a side of the first gate electrode formed over an impurity region of the drive transistor is larger than a width of the well between the other boundary of the well and a side of the second gate electrode formed over the impurity region of the select transistor.

3. The unit pixel of claim 1, wherein a potential barrier of the well disposed under an impurity region of the drive transistor is higher than a potential barrier of the well disposed under the impurity region of the select transistor.

4. The unit pixel of claim 1, wherein a width of the well disposed under the impurity region of the drive transistor is in a range from approximately 0.33 μm to approximately 1.0 μm.

5. A unit pixel, comprising:
   a well of a first conductivity type disposed in a substrate of the first conductivity type;
   a drive transistor including:
      a first impurity region disposed in the well and connected to a power voltage; and
      a first gate electrode of a second conductivity type connected to the first impurity region;
   a select transistor including:
      a second gate electrode of the second conductivity type arranged in parallel to the first gate electrode; and
      a second impurity region of the second conductivity type connected to the second gate electrode and an output node of the unit pixel;
   wherein a width of the well disposed under the second impurity region is in a range from approximately −0.1 μm to approximately −0.33 μm.

6. The unit pixel of claim 5, wherein a potential barrier of the well disposed under the first impurity region is higher than a potential barrier of the well disposed under the second impurity region.

7. The unit pixel of claim 5, wherein a width of the well disposed under the first impurity region is in a range from approximately 0.33 μm to approximately 1.0 μm.

8. The unit pixel of claim 5, wherein the first conductivity type is a P-type and the second conductivity type is an N-type.

9. A unit pixel, comprising:
   a well disposed in an active region of a substrate;
   a drive transistor including a drain region connected to a power voltage and a first gate electrode disposed on the well; and
   a select transistor including a source region connected to an output node of the unit pixel and a second gate electrode disposed in parallel to the first gate electrode;
   wherein a drain region of the drive transistor and a source region of the select transistor are asymmetrically arranged in the well; and
   wherein an end of the well is disposed below and within the second gate electrode of the select transistor.

10. The unit pixel of claim 9, wherein a width of the well in the source region of the select transistor is in the range from approximately −0.1 μm to −0.33 μm.

11. The unit pixel of claim 9, wherein the first gate electrode and the second gate electrode are an N-type.

12. The unit pixel of claim 9, wherein a width of the well between a boundary of the well and a side of the first gate electrode formed over the drain region of the drive transistor is larger than a width of the well between the other boundary of the well and a side of the second gate electrode formed over the source region of the select transistor.

13. The unit pixel of claim 9, wherein a potential barrier of the well disposed under the drain region of the drive transistor is higher than a potential barrier of the well disposed under the source region of the select transistor.

14. The unit pixel of claim 9, wherein a width of the well disposed under the drain region of the drive transistor is in a range from approximately 0.33 μm to approximately 1.0 μm.

15. A unit pixel, comprising:
   a photodiode disposed in a substrate;
   a floating diffusion node disposed in the substrate and coupled to the photodiode;
   a drive transistor including a first gate electrode coupled to the floating diffusion node and disposed across a well of the substrate; and
   a select transistor coupled between the drive transistor and an output node of the unit pixel and including a second gate electrode disposed across the well;
   wherein an end of the well is disposed below and within the second gate electrode.

16. The unit pixel of claim 15, wherein a width of the well between a boundary of the well and a side of the first gate electrode formed over a drain region of the drive transistor is larger than a width of the well between the other boundary of the well and a side of the second gate electrode formed over a source region of the select transistor.

17. The unit pixel of claim 16, wherein a potential barrier of the well disposed under the drain region of the drive transistor is higher than a potential barrier of the well disposed under the source region of the select transistor.

18. The unit pixel of claim 17, wherein:
   a width of the well disposed under the drain region of the drive transistor is in a range from approximately 0.33 μm to approximately 1.0 μm; and
   a width of the well disposed under the source region of the select transistor is in a range from approximately −0.1 μm to approximately −0.33 μm.

19. A unit pixel, comprising:
   a photodiode disposed in a substrate;

a floating diffusion node disposed in the substrate and coupled to the photodiode;

a drive transistor including a first gate electrode coupled to the floating diffusion node and disposed across a well of the substrate; and a select transistor coupled between the drive transistor and an output node of the unit pixel and including a second gate electrode disposed across the well;

wherein at least a portion of the second gate electrode extends beyond an end of the well.

20. The unit pixel of claim 19, wherein a width of the well between a boundary of the well and a side of the first gate electrode formed over a drain region of the drive transistor is larger than a width of the well between the other boundary of the well and a side of the second gate electrode formed over a source region of the select transistor.

21. The unit pixel of claim 19, wherein a potential barrier of the well disposed under the drain region of the drive transistor is higher than a potential barrier of the well disposed under the source region of the select transistor.

22. The unit pixel of claim 19, wherein:

a width of the well disposed under the drain region of the drive transistor is in a range from approximately 0.33 μm to approximately 1.0 μm; and a width of the well disposed under the source region of the select transistor is in a range from approximately −0.1 μm to approximately −0.33 μm.

* * * * *

UNITED STATES PATENT AND TRADEMARK OFFICE
CERTIFICATE OF CORRECTION

| | | |
|---|---|---|
| PATENT NO. | : 7,880,206 B2 | Page 1 of 1 |
| APPLICATION NO. | : 12/505131 | |
| DATED | : February 1, 2011 | |
| INVENTOR(S) | : Hong | |

It is certified that error appears in the above-identified patent and that said Letters Patent is hereby corrected as shown below:

Column 5, line 67, in Claim 6, delete "region ." and insert -- region. --.

Signed and Sealed this
Fifth Day of July, 2011

David J. Kappos
*Director of the United States Patent and Trademark Office*